United States Patent
Shindo (10) Patent No.: US 12,038,023 B2
(45) Date of Patent: Jul. 16, 2024

(54) ROTATIONAL FLOW GENERATOR, PIPING SYSTEM, SEMICONDUCTOR MANUFACTURING APPARATUS, AND HEAT EXCHANGER

(71) Applicant: Contamination Control services Inc., Sagamihara (JP)

(72) Inventor: Toyohiko Shindo, Sagamihara (JP)

(73) Assignee: Contamination Control services Inc., Sagamihara (JP)

( * ) Notice: Subject to any disclaimer, the term of this patent is extended or adjusted under 35 U.S.C. 154(b) by 447 days.

(21) Appl. No.: 17/293,502

(22) PCT Filed: Nov. 22, 2018

(86) PCT No.: PCT/JP2018/043255
§ 371 (c)(1),
(2) Date: May 13, 2021

(87) PCT Pub. No.: WO2020/105188
PCT Pub. Date: Feb. 8, 2020

(65) Prior Publication Data
US 2022/0010815 A1    Jan. 13, 2022

(51) Int. Cl.
*H01L 21/67* (2006.01)
*F04F 5/10* (2006.01)
*F04F 5/46* (2006.01)

(52) U.S. Cl.
CPC .......... *F04F 5/46* (2013.01); *F04F 5/10* (2013.01); *H01L 21/67051* (2013.01); *H01L 21/67103* (2013.01); *Y10T 137/87603* (2015.04)

(58) Field of Classification Search
None
See application file for complete search history.

(56) References Cited

U.S. PATENT DOCUMENTS

| | | | |
|---|---|---|---|
| 1,819,346 A * | 8/1931 | Tolman, Jr. ............ | B65G 53/58 406/194 |
| 2,794,686 A | 6/1957 | Anselman et al. | |
| 4,186,772 A * | 2/1980 | Handleman ............ | F04F 5/466 137/893 |

(Continued)

FOREIGN PATENT DOCUMENTS

| JP | H01-160200 U | 11/1989 |
|---|---|---|
| JP | 2002-089499 A | 3/2002 |

(Continued)

OTHER PUBLICATIONS

International Search Report issued in PCT/JP2018/043255; mailed Mar. 26, 2019.

*Primary Examiner* — Matthew W Jellett
(74) *Attorney, Agent, or Firm* — Studebaker & Brackett PC (57) ABSTRACT

Provided are a rotational flow generator, a piping system, a semiconductor manufacturing apparatus, and a heat exchanger that enable the clogging of a pipe member to be more effectively prevented. A rotational flow generator 1 comprises a spray port 14a that can be attached to/removed from a pipe member 103 through which a first fluid flows, and that sprays a second fluid in a direction inclined with respect to the center axis line of the pipe member 103. A rotational flow generated by the rotational flow generator 1 can reduce the amount of accretion on an inner wall of the pipe member 103.

9 Claims, 8 Drawing Sheets

(56) References Cited

U.S. PATENT DOCUMENTS 5,676,173 A * 10/1997 Conrad ................ G05D 11/006
251/126

FOREIGN PATENT DOCUMENTS

| | | | |
|---|---|---|---|
| JP | 2003-047892 A | | 2/2003 |
| JP | 2004-165584 A | | 6/2004 |
| JP | 2006-005118 A | | 1/2006 |
| JP | 2007-250696 A | | 9/2007 |
| JP | 2011-141024 A | | 7/2011 |
| JP | 2017028188 A | * | 2/2017 |
| JP | 2018-146150 A | | 9/2018 |

* cited by examiner

ROTATIONAL FLOW GENERATOR, PIPING SYSTEM, SEMICONDUCTOR MANUFACTURING APPARATUS, AND HEAT EXCHANGER

TECHNICAL FIELD

The present invention relates to a rotational flow generator, a piping system, a semiconductor manufacturing apparatus, and a heat exchanger.

BACKGROUND ART

For example, a pipe member for exhausting gas of a semiconductor manufacturing apparatus that performs processing using a reaction gas is easily clogged because reaction by-products or the like are contained in the exhaust gas. To prevent the clogging, a sheet heater is wound around the outside of the pipe member and heated to make it difficult for the by-products to adhere to the pipe member (see Patent Document 1).

Further, there is also a method in which a high-temperature dilution gas flows into the interior of a pipe member, and by-products are decomposed and flow out together with the dilution gas (see Patent Document 2).

In addition, there is also a device that includes a shaft, and a guide blade fixed to the shaft, and generates a rotational flow in a pipe (see Patent Document 3).

Patent Document 1: Japanese Unexamined Patent Application, Publication No. 2007-250696
Patent Document 2: Japanese Unexamined Patent Application, Publication No. 2004-165584
Patent Document 3: Japanese Unexamined Patent Application, Publication No. 2011-141024

DISCLOSURE OF THE INVENTION

Problems to be Solved by the Invention

According to the conventional art disclosed in Patent Document 1, in principle, the adhesion of the by-products to the inner wall of the pipe member is eliminated by heating the pipe member. However, since there are actually various parts, it cannot be heated to a sufficiently high temperature to prevent the adhesion of the by-products to the inner wall, and thus clogging occurs.

According to the conventional art disclosed in Patent Document 2, the flow velocity on the inner wall becomes very slow, so that the temperature at the inner wall decreases and clogging occurs.

According to the conventional art disclosed in Patent Document 3, adhered substances on the inner wall are reduced, but when the device is used for a long period of time, deposits may occur on the inner wall.

An object of the present invention is to provide a rotational flow generator, a piping system, a semiconductor manufacturing apparatus, and a heat exchanger that can better prevent clogging of pipe members.

Means for Solving the Problems

To achieve the above object, the present invention provides a rotational flow generator, detachably attached to a pipe member through which a first fluid flows. The generator includes a jetting port that jets a second fluid in a direction inclined with respect to a central axis of the pipe member.

The direction is preferably in a torsional positional relationship with respect to an axis of the rotational flow generator.

The direction may be along a tangent of a circle around the axis of the rotational flow generator and inclined with respect to the axis on a plane that is parallel to the axis.

The jetting port may be provided so as to jet the second fluid along a pipe wall located on a downstream side of a portion where the jetting port is provided.

The direction may be inclined so that the second fluid moves radially outward of a pipe located on the downstream side of the portion where the jetting port is provided as the second fluid moves toward a downstream side of a flow path for the first fluid.

The direction may be inclined so that the second fluid moves radially inward of the pipe located on the downstream side of the portion where the jetting port is provided as the second fluid moves toward the downstream side of the flow path for the first fluid.

The generator may include a second fluid chamber surrounding an outer periphery of the flow path for the first fluid and provided with an inflow port into which the second fluid flows. The jetting port may be provided in a through hole provided in a side wall of the second fluid chamber, the side wall separating the second fluid chamber from the flow path.

The through hole may be provided so as to be inclined with respect to a flow direction of the first fluid.

The through hole may be parallel to the flow direction of the first fluid. A tube may be inserted into the through hole. A leading end of the tube may include a protrusion that protrudes from the side wall into the flow path and is inclined with respect to the flow direction of the first fluid.

Further, the present invention provides a piping system including the above-described rotational flow generator.

In addition, the present invention provides a semiconductor manufacturing apparatus including the above-described rotational flow generator.

Further, the present invention provides a heat exchanger including the above-described rotational flow generator.

Effects of the Invention

According to the present invention, it is possible to provide a rotational flow generator, a piping system, a semiconductor manufacturing apparatus, and a heat exchanger that can better prevent clogging of pipe members.

BRIEF DESCRIPTION OF THE DRAWINGS

FIG. 10 is a diagram illustrating a form of applying the rotational flow generator of the embodiment to the sewage treatment piping of an apartment or the like.

PREFERRED MODE FOR CARRYING OUT THE INVENTION (First Embodiment)

Figure 1:
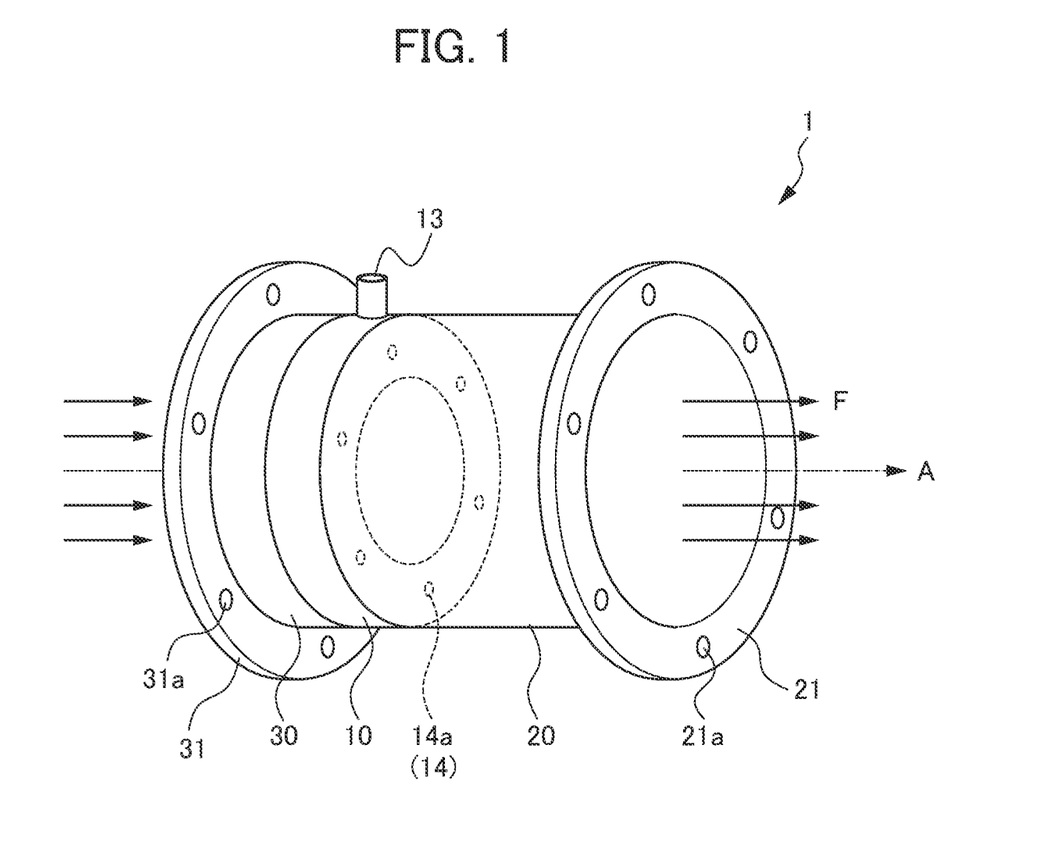
FIG. 1 is a schematic perspective view of a rotational flow generator 1 of a first embodiment.

Embodiments of the present invention will be described below with reference to the drawings. FIG. 1 is a schematic perspective view of a rotational flow generator 1 of a first embodiment. The rotational flow generator 1 is a substantially cylindrical member arranged in the middle of a flow path F for a first fluid.

The rotational flow generator 1 includes a rotational flow generating portion 10, a downstream cylinder 20 that extends to the downstream side of the flow path F for the first fluid with respect to the rotational flow generating portion 10, an upstream cylinder 30 that extends to the upstream side thereof, a downstream flange 21 attached to the downstream end of the downstream cylinder 20, and an upstream flange 31 attached to the upstream end of the upstream cylinder 30. Bolt holes 21a and 31a are respectively provided in the downstream flange 21 and the upstream flange 31.

(Rotational Flow Generating Portion 10)

Figure 2:
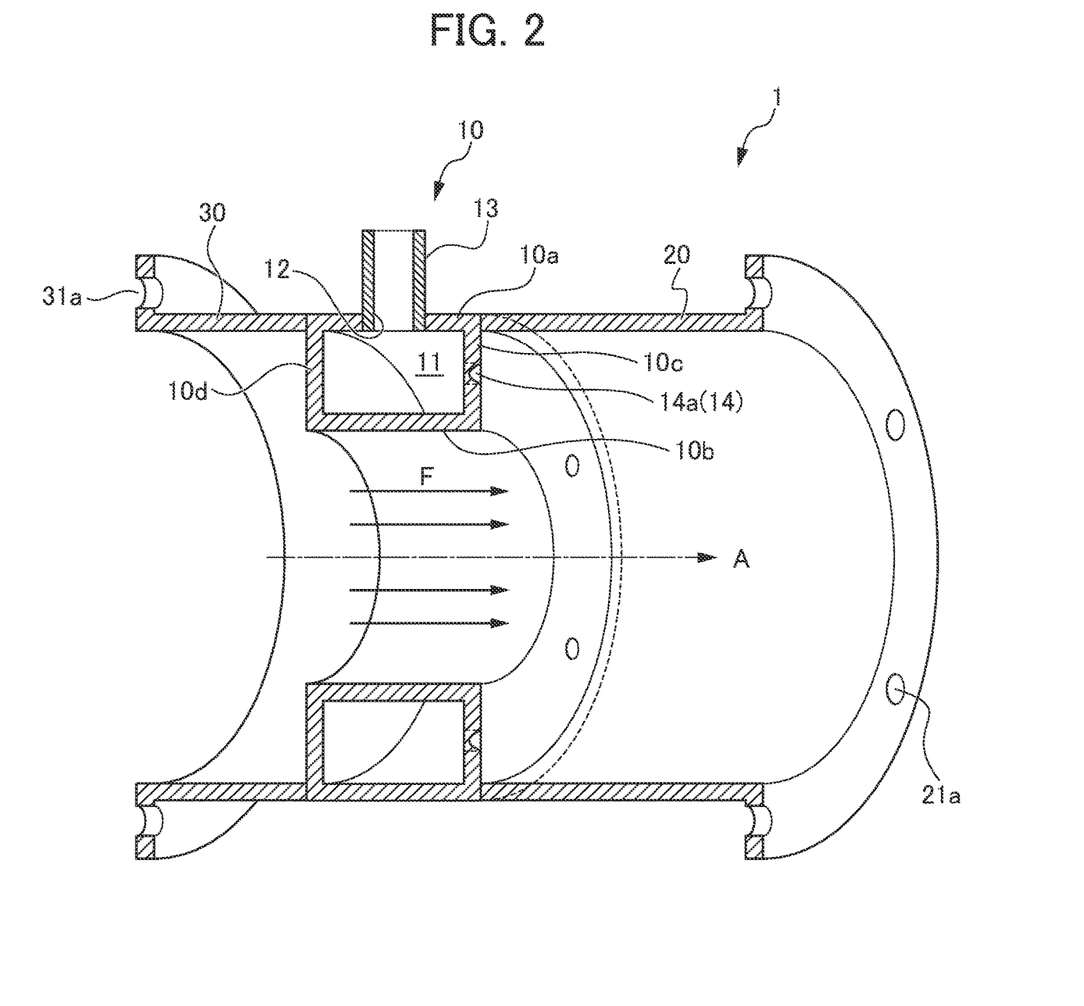
FIG. 2 is a cross-sectional perspective view of the rotational flow generator 1.

FIG. 2 is a cross-sectional perspective view of the rotational flow generator 1. The rotational flow generating portion 10 of the rotational flow generator 1 is an annular member that surrounds the outer periphery of the flow path F through which the first fluid flows.

The rotational flow generating portion 10 includes an outer circular pipe 10a, an inner circular pipe 10b that has the same length as that of the outer circular pipe 10a and is arranged coaxially with the outer circular pipe 10a, a front circular plate 10c that has the same outer diameter as that of the outer circular pipe 10a and the same inner diameter as that of the inner circular pipe 10b, and a rear circular plate 10d that has the same outer diameter as that of the outer circular pipe 10a and the same inner diameter as that of the inner circular pipe 10b.

Then, by covering the front side of the outer circular pipe 10a and the inner circular pipe 10b, which are coaxially arranged with each other, with the front circular plate 10c, and the rear side thereof with the rear circular plate 10d, a second fluid chamber 11 is formed therebetween.

(Inflow Pipe 13)

An inflow port 12 is formed in the outer circular pipe 10a, and an inflow pipe 13 extends from the inflow port 12 radially outward.

(Second Fluid Flow Hole 14)

The front circular plate 10c is a side wall that separates the second fluid chamber 11 from the flow path F for the first fluid, and is provided with a second fluid flow hole 14 that penetrates in a thickness direction and includes a jetting port 14a on the side of the first fluid. The second fluid flow holes 14, in the front circular plate 10c, are provided at six locations at equal intervals from one another on a circumference around an axis A of the rotational flow generating portion 10. Note that the number of the second fluid flow holes may be 6 or more, or 6 or less. Note that the axis A is parallel to the flow path F for the first fluid.

Figure 3:
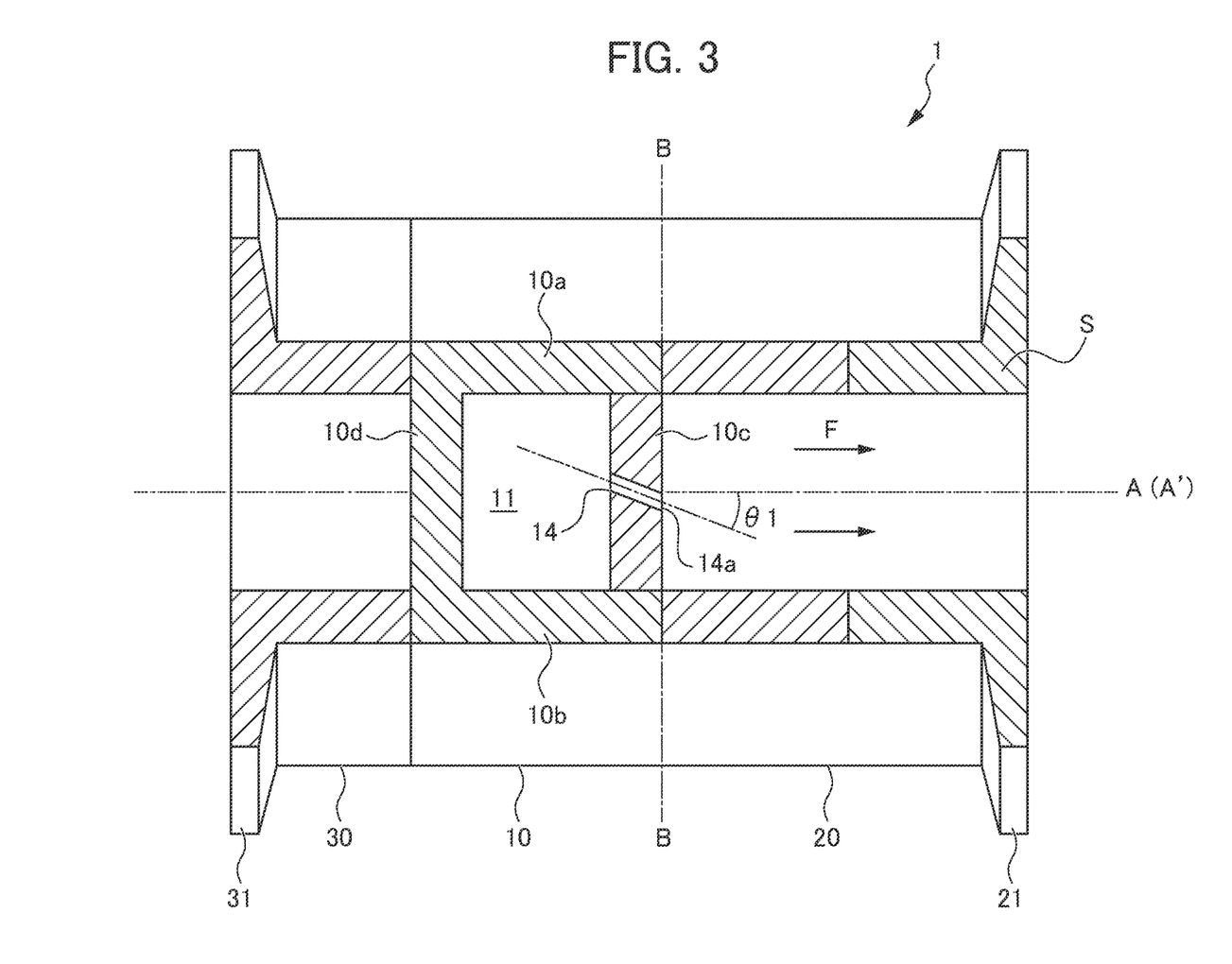
FIG. 3 is a cross-sectional view of the rotational flow generator 1, the cross-sectional view including line B-B, which is a tangent to a circle around an axis A, and being cut by a plane S that is parallel to the axis A and passes through a second fluid flow hole 14.

FIG. 3 is a cross-sectional view of the rotational flow generator 1, the cross-sectional view including line B-B, which is a tangent to a circle around the axis A, and being cut by a plane S that is parallel to the axis A and passes through the second fluid flow hole 14.

As illustrated, the second fluid flow hole 14 is inclined with respect to the axis A of the rotational flow generating portion 10. Moreover, in the embodiment, the second fluid flow hole 14 and the axis A are in a torsional relationship. The torsional relationship is a positional relationship in which the second fluid flow hole 14 is not parallel to and does not intersect the axis A.

When expressing the relationship between the second fluid flow hole 14 and the axis A in another way, the second fluid flow hole 14 is inclined at an angle $\theta 1$ with respect to a straight line A' parallel to the axis A on a plane that includes the second fluid flow hole 14 and is parallel to the axis A.

Further, when expressing the relationship in another way, the second fluid flow hole 14 is inclined at the angle $\theta 1$ with respect to the straight line A' parallel to the axis A on the plane S (tangent plane, a plane that "just touches" a circle at the point of contact) that is along the line B-B, which is a tangent to the circle around the axis A, and is parallel to the axis A.

The angle $\theta 1$ is preferably 20 degrees to 70 degrees, and more preferably 30 degrees to 60 degrees. If the angle $\theta 1$ is less than 20 degrees, the cleaning effect is inferior, and if the angle $\theta 1$ is more than 70 degrees, the manufacturing is difficult. In the embodiment, the angle $\theta 1$ is 30 degrees.

(Example of Application to Semiconductor Apparatus)

Figure 4:
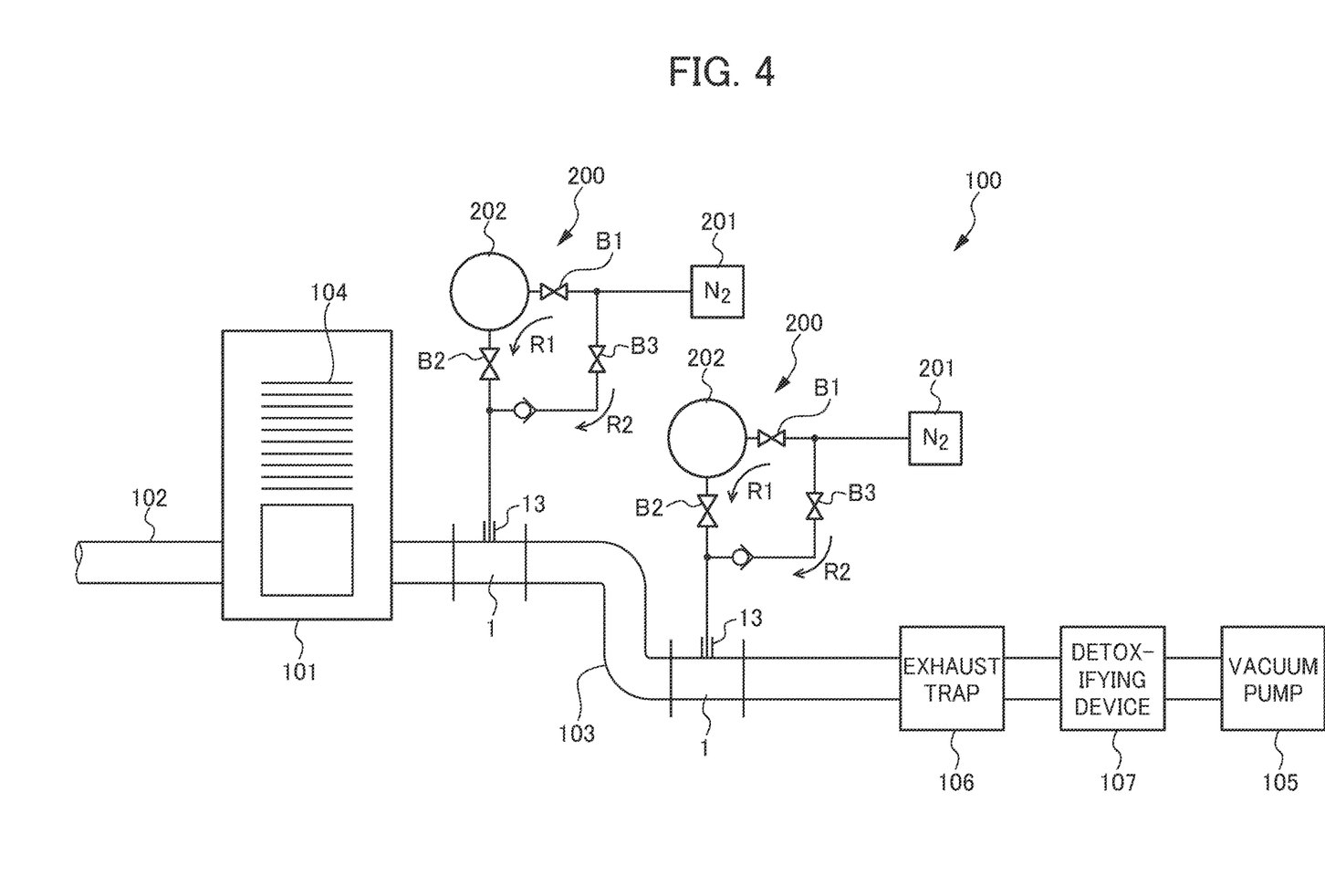
FIG. 4 is a diagram showing an example of applying the rotational flow generator 1 of the embodiment to a semiconductor manufacturing apparatus 100.
Figure 5:
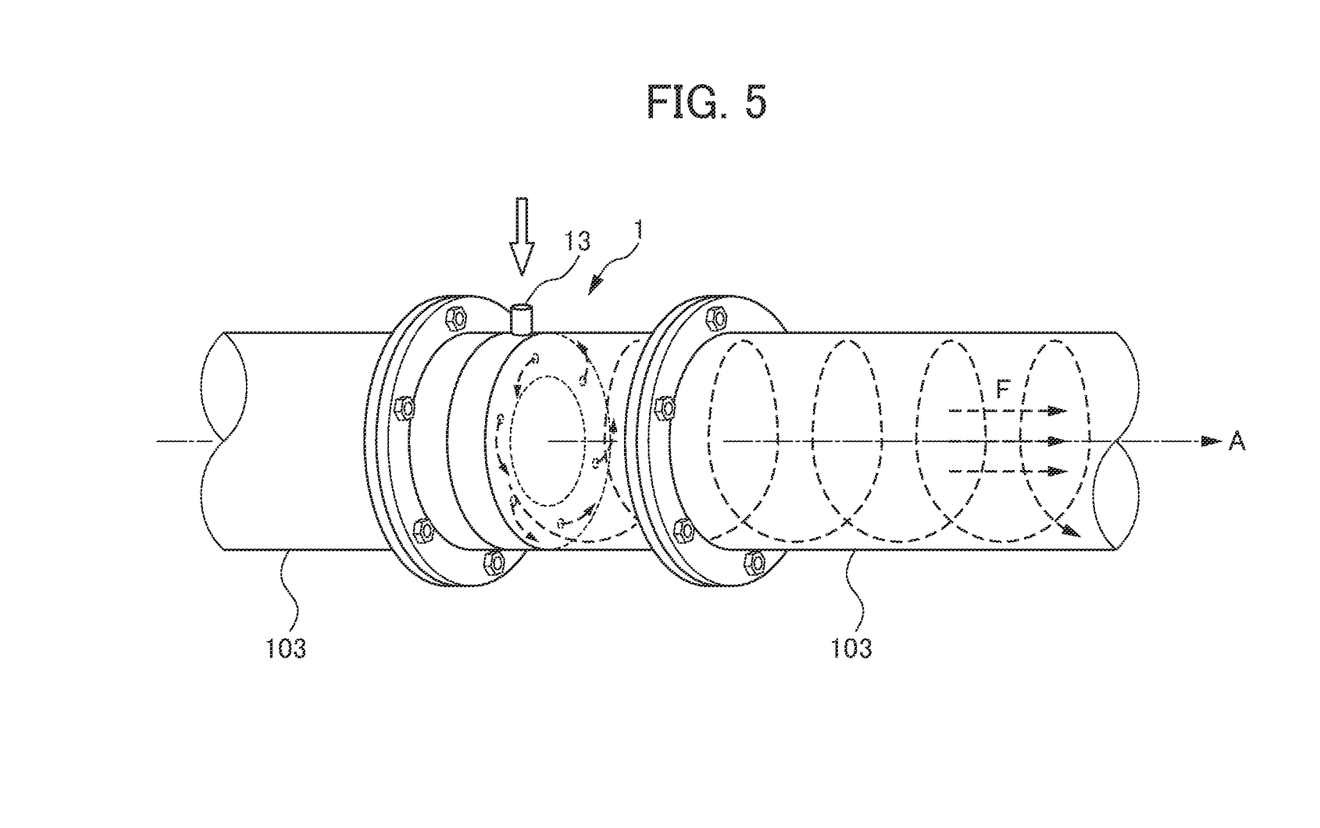
FIG. 5 is an enlarged view of a portion of the semiconductor manufacturing apparatus 100 to which the rotational flow generator 1 is connected.

FIG. 4 is a diagram showing an example of applying the rotational flow generator 1 of the embodiment to a semiconductor manufacturing apparatus 100. FIG. 5 is an enlarged view of a portion of the semiconductor manufacturing apparatus 100 to which the rotational flow generator 1 is connected.

The semiconductor manufacturing apparatus 100 includes a substrate processing chamber 101 to which a gas supply pipe 102 and a gas exhaust pipe (pipe member) 103 are connected, the rotational flow generator 1 of the embodiment attached to the gas exhaust pipe 103, an exhaust trap 106, a detoxifying device 107, a vacuum pump 105, and a second fluid supply equipment 200 that supplies a second fluid to the rotational flow generator 1.

(Substrate Processing Chamber 101)

The substrate processing chamber 101 is formed of quartz or the like, and a substrate 104 to be processed is put in and taken out through an opening.

(Gas Supply Pipe 102)

The gas supply pipe 102 is connected to one side of the substrate processing chamber 101. The gas supply pipe 102 supplies a processing gas to the substrate processing chamber 101.

(Gas Exhaust Pipe 103)

The gas exhaust pipe 103 is connected to the other side of the substrate processing chamber 101. The gas exhaust pipe 103 is connected to the vacuum pump 105 on the downstream side of the flow path F. Between the vacuum pump 105 and the substrate processing chamber 101, the rotational flow generator 1 according to the embodiment, the exhaust trap 106, and the detoxifying device 107 are arranged. In FIG. 4, two rotational flow generators 1 are provided, but the present invention is not limited to this, and the number of the rotational flow generators 1 may be one, or three or more.

(Vacuum Pump 105)

The vacuum pump 105 exhausts processed gas (first fluid) and the like generated by the reaction of the processing gas in the substrate processing chamber 101 through the gas exhaust pipe 103.

(Exhaust Trap 106)

The exhaust trap 106 removes reaction by-products and the like from the processed gas exhausted from the substrate processing chamber 101 and flowing through the gas exhaust pipe 103. The exhaust trap 106 is replaceable so that trapped reaction by-products and the like can be collected.

(Detoxifying Device 107)

The detoxifying device 107 detoxifies harmful components contained in the processed gas containing the cleaning gas described later.

(Second Fluid Supply Equipment 200)

The second fluid supply equipment 200 includes a cleaning gas source 201, an accumulator 202, a first cleaning gas flow path R1 connected from the cleaning gas source 201 through the accumulator 202 to the inflow pipe 13, and a second cleaning gas flow path R2 connected from the cleaning gas source 201 to the inflow pipe 13 without passing through the accumulator 202.

The first cleaning gas flow path R1 is provided with a first valve B1 and a second valve B2, and the second cleaning gas flow path R2 is provided with a third valve B3 and a check valve B4.

As the cleaning gas, for example, $N_2$ gas, hot $N_2$ gas, a mixed gas of $N_2$ gas and $F_2$ gas, or the like, which can remove reaction by-products, may be used depending on the application.

In the semiconductor manufacturing apparatus 100 having the above structure, a substrate 104 is placed in the substrate processing chamber 101, and the processing gas is supplied to the substrate processing chamber 101 through the gas supply pipe 102. Then, for example, a film is generated on the surface of the substrate 104 by the processing gas supplied to the substrate processing chamber 101.

The processed gas after reacting in the substrate processing chamber 101, is sucked and exhausted through the gas exhaust pipe 103 by driving the vacuum pump 105. At that time, the reaction by-products and the like contained in the processed gas are trapped and collected by the exhaust trap 106.

However, the flow path F for the processed gas has the fastest flow velocity in the central portion of the gas exhaust pipe 103, and becomes slower as it approaches the inner wall. In this case, when there is no flow of the cleaning gas of the embodiment described later, there is a possibility that the processed gas stagnates in the vicinity of the inner wall and the reaction by-products adhere to the inner wall.

In the embodiment, such adhesion of reaction by-products in the vicinity of the inner wall can be prevented as follows.

(Steady State)

First, in the second fluid supply equipment 200, the valves B1 and B3 are set to the open state, and the valve B2 is set to the closed state (normal flow state).

In this state, the cleaning gas flows into the second fluid chamber 11 of the rotational flow generator 1 from the inflow pipe 13 through the second cleaning gas flow path R2 at a predetermined pressure. The cleaning gas that has flowed into the second fluid chamber 11 is jetted from the second fluid flow hole 14.

At this time, since the jetted cleaning gas has an angle with respect to the axis A, it forms a rotational flow (swirling flow, spiral flow) that flows in a downstream direction while rotating around the axis A as shown in FIG. 5. The cleaning gas flowing as a rotating flow through the gas exhaust pipe 103 collides with the inner wall surface of the gas exhaust pipe 103 and destroys a boundary layer formed on the surface (or prevents the formation of a boundary layer). Therefore, it is possible to suppress the precipitation of the reaction by-products contained in the processed gas, which is caused by decreases in the flow rate and the temperature due to the boundary layer.

As a result, it is possible to suppress clogging of the gas exhaust pipe 103 due to adhesion of reaction by-products and the like to the inner wall surface, to reduce the frequency of maintenance and the downtime therefor, and to improve the operating efficiency of the semiconductor manufacturing apparatus 100.

(Large Flow State)

In the above-described steady state, the valve B1 is open and the valve B2 is closed, so that the cleaning gas accumulates in the accumulator 202. Then, when the valve B2 is opened periodically, the cleaning gas accumulated in the accumulator 202 flows into the gas exhaust pipe 13 at once. Thus, since a large flow of the cleaning gas is jetted from the second fluid flow hole 14, even when a reaction by-product is precipitated in a steady state, the precipitated reaction by-product can be cleaned out at once.

(Second Embodiment)

Figure 6:
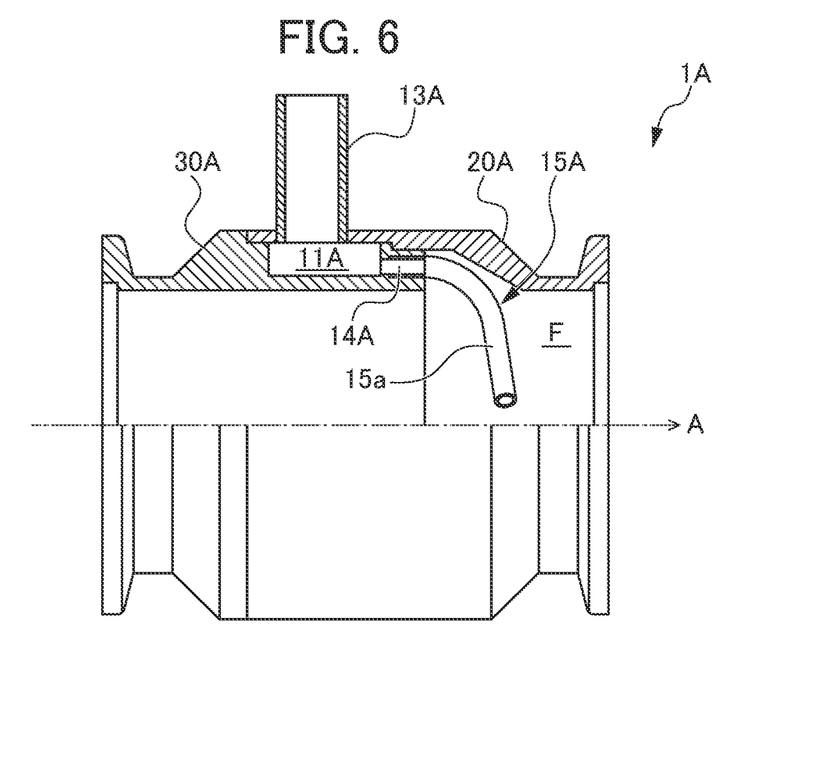
FIG. 6 is a diagram illustrating a rotational flow generator 1A of a second embodiment.
Figure 7:
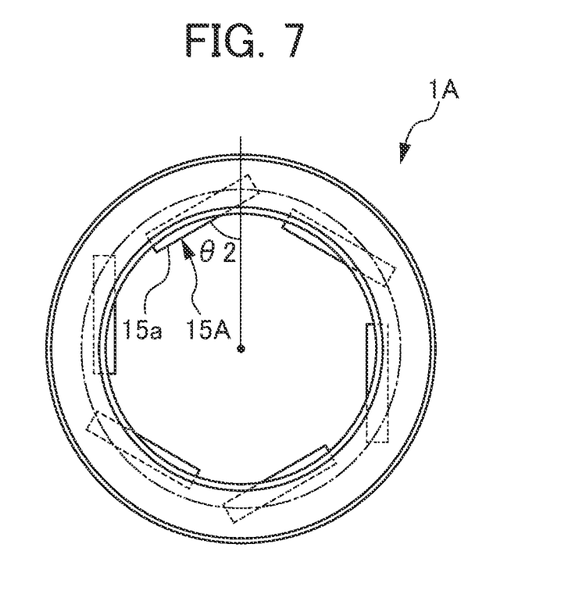
FIG. 7 is a view of the rotational flow generator 1A of the second embodiment from a downstream side.

A second embodiment of the present invention will be described. FIG. 6 is a diagram illustrating a rotational flow generator 1A of the second embodiment. The upper half is a cross-sectional view, and the lower half is a side view. FIG. 7 is a view of the rotational flow generator 1A of the second embodiment from a downstream side.

The difference from the first embodiment is that a second fluid flow hole 14A is parallel to an axis A of the rotational flow generating portion 10A, and a tube 15A extending from a second fluid chamber 11A to a flow path F is inserted into the second fluid flow hole 14A. Then, the tube 15A protrudes into the flow path F and toward the front side, and a protrusion 15a is inclined with respect to the direction of flow of the first fluid.

The protrusion 15a is inclined at an angle θ1 with respect to a straight line A' parallel to the axis A on a plane that includes the protrusion 15a and is parallel to the axis A. The angle θ1 of inclination with respect to the axis A is preferably from 15 degrees to 80 degrees, and more preferably from 45 degrees to 80 degrees. If the angle θ1 is less than 15 degrees, the pitch of the gas swirl flow is too large, and thus the cleaning effect tends to be uneven. If the angle θ1 is over 80 degrees, the pitch of the gas swirl flow is too small, and thus it is difficult to clean long distances.

In addition, as shown in FIG. 7, in a plan view of the rotational flow generator 1A from the downstream side, the angle θ2 between a straight line extending radially from the center point (axis A) to the start point of the protrusion 15a and the protrusion 15a is preferably 20 degrees to 170 degrees, more preferably 40 degrees to 130 degrees, and particularly preferably 50 degrees to 70 degrees. If the angle θ2 is less than 20 degrees, or more than 170 degrees, the cleaning effect will be low.

Further, a rotational flow generating portion 10 is not manufactured separately from a downstream cylinder 20 and an upstream cylinder 30. The second fluid chamber 11 is formed by making the wall of the downstream side of the upstream cylinder 30 thicker, forming a recess on the outer periphery side of the thicker part, and covering the recess with the upstream side of the downstream cylinder 20. The second fluid flow hole 14A is formed by forming a groove parallel to the axis A at the downstream end of the upstream cylinder 30, and covering the outer periphery of the groove with the downstream cylinder 20.

Since the rotational flow generator 1A of the second embodiment functions similarly to the rotational flow generator 1 of the first embodiment, it has the same effect as that of the rotational flow generator 1 of the first embodiment.

Further, according to the second embodiment, since the second fluid flow hole 14A does not need to be formed obliquely, manufacturing of the second fluid flow hole 14A is easy.

For example, by inserting the tube 15A made of metal into the second fluid flow hole 14A and bending the protrusion 15a obliquely with respect to the flow path F, it is possible to easily manufacture a jetting port that jets a second fluid toward the inner wall of the gas exhaust pipe 103.

Further, since the rotational flow generating portion 10 is not manufactured separately from the downstream cylinder 20 and the upstream cylinder 30, the manufacturing is easier.

In addition, by changing the angle θ1 and/or θ2 of the inclination with respect to the axis A for each tube 15A, it is possible to easily form a rotational flow (swirling flow, spiral flow) flowing in various directions (pitch). By generating a rotational flow flowing in various directions as described above, it is possible to more effectively prevent reaction by-products and the like from adhering to the inner wall surface and remove adhered substances.

(Modifications)

The present invention is not limited to the above-described embodiments, and various modifications and changes as indicated below are possible, and they are also within the scope of the present invention.

As described above, it is preferable that the second fluid flow hole 14 or the protrusion 15a of the tube 15A and the axis A are in a torsional relationship. However, if the second fluid flow hole 14 or the protrusion 15a is inclined with respect to the axis A of the rotational flow generator 1, 1A, the effect of pushing the fluid flowing in the flow path F against the pipe wall is obtained, and therefore the second fluid flow hole 14 or the projection 15a and the axis A do not have to be in a torsional relationship.

Further, the second fluid flow hole 14 or the protrusion 15a may not be parallel to the plane S, and may be inclined with respect to the plane S. If inclined, the second fluid flow hole 14 or the protrusion 15a may be inclined radially outward as it extends toward the downstream side of the flow path F for the first fluid, or it may be inclined radially inward as it extends toward the downstream side of the flow path F for the first fluid.

The above-described rotational flow generator is a form in which the downstream cylinder and the upstream cylinder each having a flange for connection with the pipe member through which the first fluid flows are attached to both ends of the rotational flow generating portion, but is not limited thereto. For example, the outer diameter of each of the front circular plate 10c and the rear circular plate 10d of the rotational flow generating portion may be larger than the outer diameter of the outer circular pipe 10a to serve as flanges, and the downstream cylinder and the upstream cylinder may not be provided.

Figure 8:
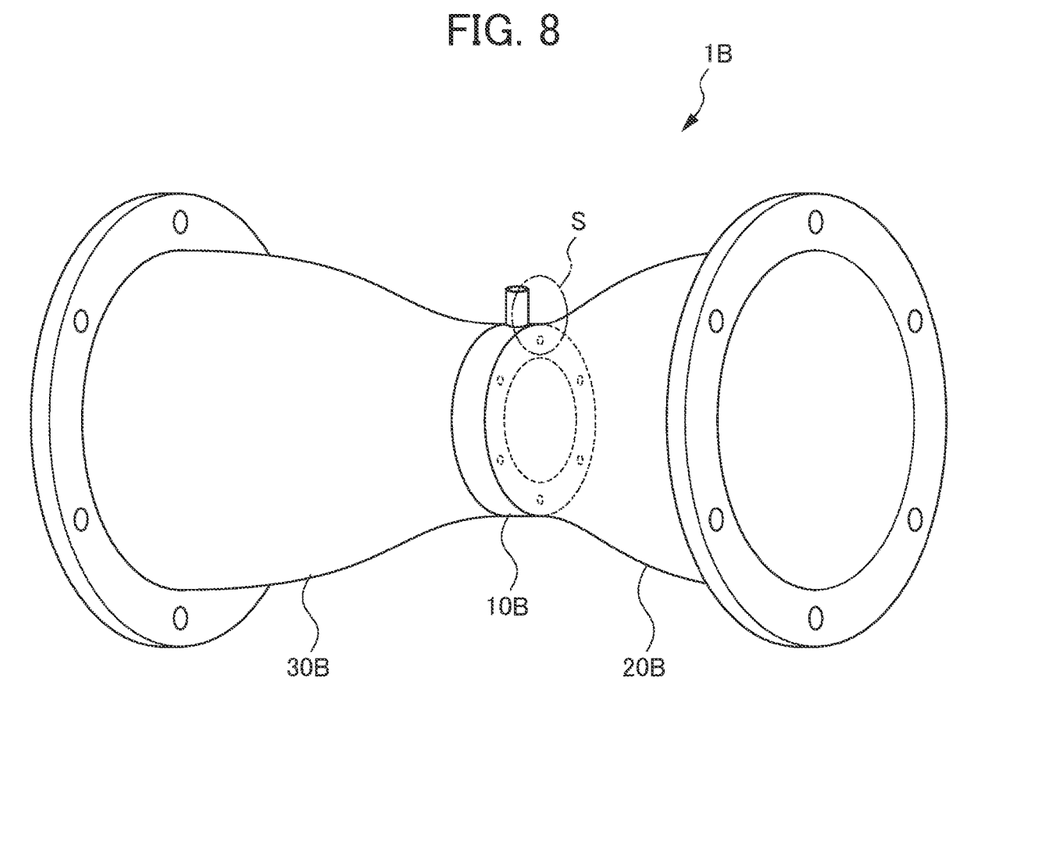
FIG. 8 is a diagram illustrating a form of applying the present invention to a Venturi tube.
Figure 9:
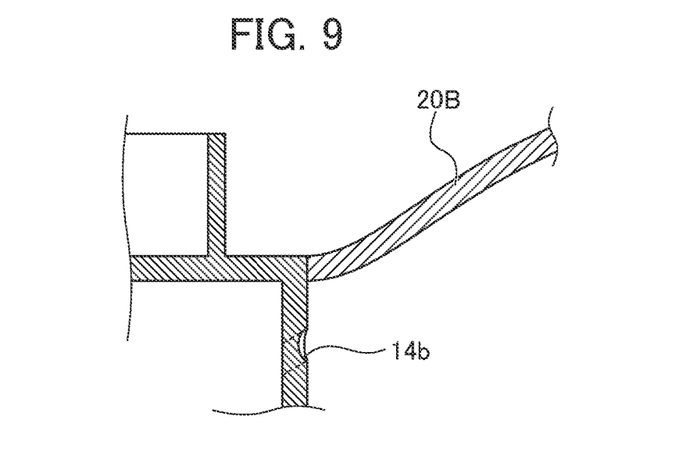
FIG. 9 is an enlarged view of an S portion of FIG. 8.

The above-described rotational flow generator is a form in which a downstream cylinder and an upstream cylinder that have the same diameter are attached to both ends of the rotational flow generating portion, but is not limited thereto. FIG. 8 is a diagram illustrating a form of applying the present invention to a Venturi tube. FIG. 9 is an enlarged view of an S portion of FIG. 8.

As shown in FIG. 8, a downstream cylinder 20B and an upstream cylinder 30B decrease in diameter toward a rotational flow generating portion 10B. That is, it is a structure in which the rotational flow generating portion 10B is attached to a Venturi tube. In this manner, by providing the rotational flow generating section 10B in the Venturi tube, it is possible to prevent adhered substances in the Venturi tube as well.

Note that, in this way, when the pipe wall of a pipe 20B on the downstream side of the rotational flow generating portion 10B is oblique (the pipe diameter increases or reduces toward the downstream side), a second fluid flow hole 14b and an axis A are in a torsional relationship, and as shown in FIG. 9, the second fluid flow hole 14b is preferably inclined along the pipe wall of the pipe on the downstream side of the rotational flow generating portion 10B.

The embodiment suppresses the adhesion of reaction by-products and the like contained in processed gas to the inner wall of the gas exhaust pipe 103 by the rotational flow generated by the rotational flow generator 1. Alternatively, the rotational flow generator 1 of the present invention may be applied to a pipe line for a heat medium in a heat exchanger. By applying the rotational flow generator to the heat exchanger, it is possible to destroy a boundary layer of the inner wall surface of the pipe line by the rotational flow, thus improving the heat exchange efficiency.

Figure 10:
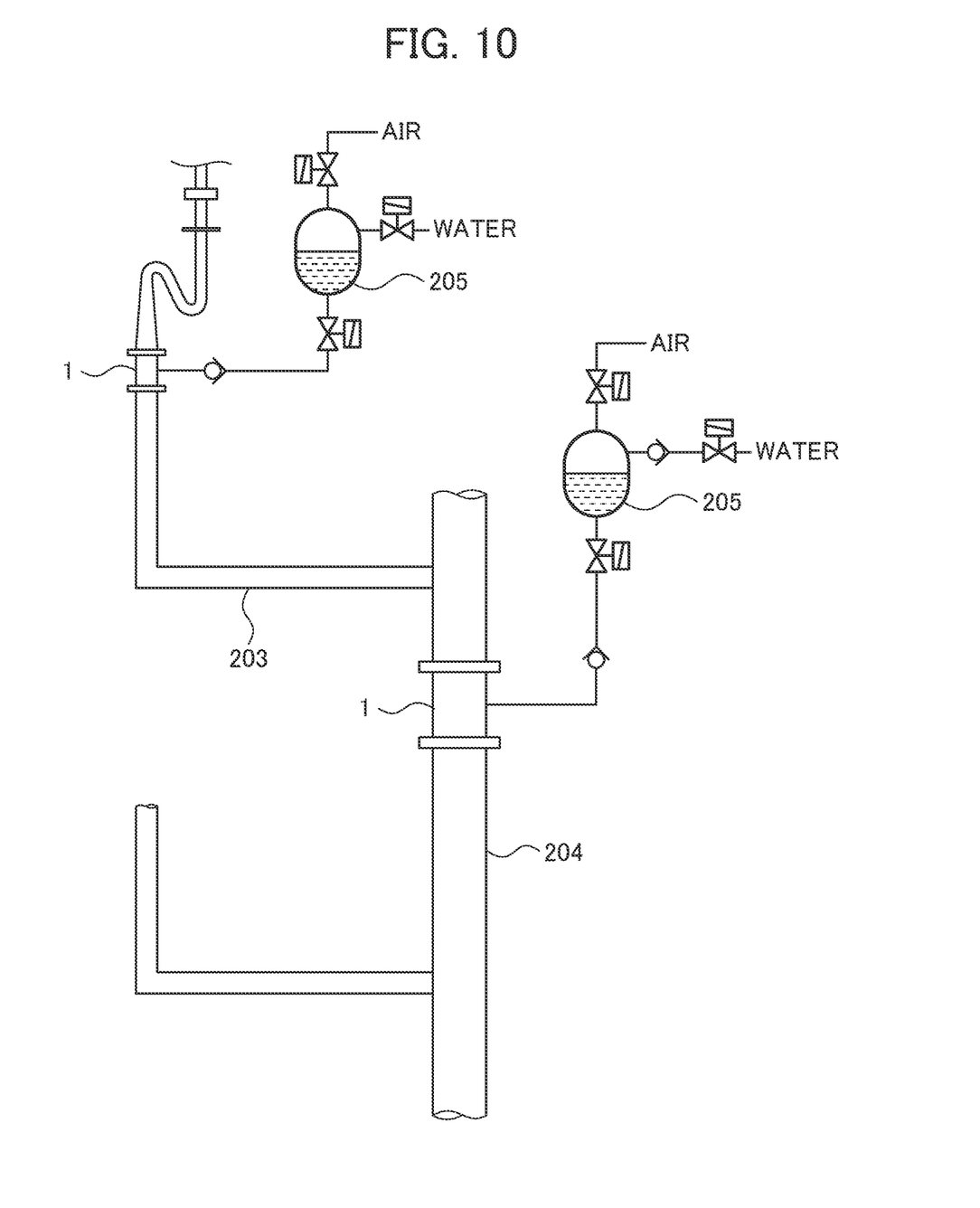

Further, the rotational flow generator 1 of the embodiment can prevent clogging of pipes in fields such as hot spring supply pipes and sewage treatment pipes. FIG. 10 is a diagram illustrating a form of applying the rotational flow generator 1 of the embodiment to the sewage treatment piping of an apartment or the like.

For example, the rotational flow generator 1 is attached in the middle of a sewage pipe 203 extending from each house, and the rotational flow generator 1 is also attached to a mainstream sewage pipe 204. A pressurizing tank 205 is attached to each rotational flow generator 1 via a check valve and a valve. A water supply source and an air supply source are connected to the pressurizing tank 205.

A rotational flow is generated in the sewage pipe 203 extending from each house by opening a valve c between the water and the pressurizing tank 205 and a valve a between the pressurizing tank 205 and the rotational flow generator 1 to constantly flow a small amount of water. This can prevent clogging of the sewage pipe 203.

Further, if clogging occurs in the case of flowing a small amount of water, the valve b is opened to supply air to the pressurizing tank 205, water flows into the rotational flow generator 1 with increased water pressure, a strong rotational flow is generated in the sewage pipes 203 and 204, and thereby it is possible to eliminate the clogging.

The above-described embodiments and modifications can be used in combination as appropriate, but a detailed description thereof is omitted. The present invention is not limited to the embodiments described above.

EXPLANATION OF REFERENCE NUMERALS 1 rotational flow generator
10 rotational flow generating portion
10c front circular plate
11 second fluid chamber
12 inflow port
13 inflow pipe
14 second fluid flow hole
14a jetting port
20 downstream cylinder 30 upstream cylinder
100 semiconductor manufacturing apparatus
101 substrate processing chamber
102 gas supply pipe
103 gas exhaust pipe
104 substrate
105 vacuum pump
106 exhaust trap
107 detoxifying device
200 second fluid supply equipment
201 cleaning gas source
202 accumulator

The invention claimed is:

1. A rotational flow generator, detachably attached to a pipe member through which a first fluid flows, the generator comprising:
   a circular plate extending into a flow path of the first fluid from an outer pipe of the generator, the circular plate having an outer diameter equal to the outer pipe;
   a jetting port disposed in the circular plate configured to jet a second fluid in a direction inclined with respect to a central axis of the pipe member;
   wherein the direction is inclined with respect to a straight line parallel to an axis of the rotational flow generator, and the jet of the second fluid intersects a tangent plane tangent to a cylinder around the axis; and
   wherein the direction is inclined so that the second fluid moves radially outward of a pipe located on a downstream side of a portion where the jetting port is provided as the second fluid moves toward a downstream side of a flow path for the first fluid.

2. The generator according to claim 1, wherein the direction is in a torsional positional relationship with respect to an axis of the rotational flow generator.

3. The generator according to claim 1, wherein the jetting port is provided so as to jet the second fluid along a pipe wall located on a downstream side of a portion where the jetting port is provided.

4. The generator according to claim 1, wherein the generator comprises a second fluid chamber surrounding an outer periphery of a flow path for the first fluid and provided with an inflow port into which the second fluid flows, and
   wherein the jetting port is provided in a through hole provided in a side wall of the second fluid chamber, the side wall separating the second fluid chamber from the flow path.

5. The generator according to claim 4, wherein the through hole is provided so as to be inclined with respect to a flow direction of the first fluid.

6. The generator according to claim 4, wherein the through hole is parallel to a flow direction of the first fluid,
   wherein a tube is inserted into the through hole, and
   wherein a leading end of the tube includes a protrusion that protrudes from the side wall into the flow path, the protrusion being inclined with respect to the flow direction of the first fluid.

7. A piping system comprising the generator according to claim 1.

8. A semiconductor manufacturing apparatus comprising the generator according to claim 1.

9. A heat exchanger comprising the generator according to claim 1.

* * * * *